United States Patent
Reichert

(10) Patent No.: US 11,716,219 B2
(45) Date of Patent: Aug. 1, 2023

(54) GALVANIC ISOLATION DEVICE FOR A LIN BUS SYSTEM

(71) Applicant: NIDEC-DriveXpert GmbH, Ilmenau (DE)

(72) Inventor: Robert Reichert, Ilmenau (DE)

(73) Assignee: NIDEC-DRIVEXPERT GMBH, Ilmenau (DE)

( * ) Notice: Subject to any disclaimer, the term of this patent is extended or adjusted under 35 U.S.C. 154(b) by 452 days.

(21) Appl. No.: 17/081,396

(22) Filed: Oct. 27, 2020

(65) Prior Publication Data
US 2021/0126811 A1    Apr. 29, 2021

(30) Foreign Application Priority Data
Oct. 28, 2019    (DE) .................... 10 2019 129 075.9

(51) Int. Cl.
*H04L 12/40*    (2006.01)
*H04B 10/80*    (2013.01)
*H03F 3/21*    (2006.01)

(52) U.S. Cl.
CPC .............. *H04L 12/40* (2013.01); *H03F 3/21* (2013.01)

(58) Field of Classification Search
CPC ..... H04B 10/801; H04B 10/802; H04L 12/40; H04L 25/26; H03F 3/21
See application file for complete search history.

(56) References Cited

U.S. PATENT DOCUMENTS 4,956,048 A * 9/1990 Hise .................. D21C 9/14
                                                162/88

FOREIGN PATENT DOCUMENTS

CN    201133951 Y    10/2008

OTHER PUBLICATIONS

Office Action dated Aug. 6, 2020 in German Application No. 10 2019 129 075.9 (Office Action cited to show evidence of relevance, no english translation).

* cited by examiner

*Primary Examiner* — Kevin K Pyo
(74) *Attorney, Agent, or Firm* — Panitch Schwarze Belisario & Nadel LLP

(57) ABSTRACT

The present disclosure relates to a galvanic isolation device or a bidirectional connecting line of a LIN bus system with two optocouplers arranged in antiparallel, each having a light-emitting element and a light-receiving element, wherein the galvanic isolation device is connectable to a LIN bus via a first signal connection and to a microprocessor via a second signal connection, wherein each signal connection is connected to the respective light-emitting element of an optocoupler, and wherein a diode is connected in antiparallel to the light-emitting element, such that, when a low signal level is applied to one of the signal connections, the signal level at the other signal connection is also low, without the signal being fed back.

6 Claims, 1 Drawing Sheet

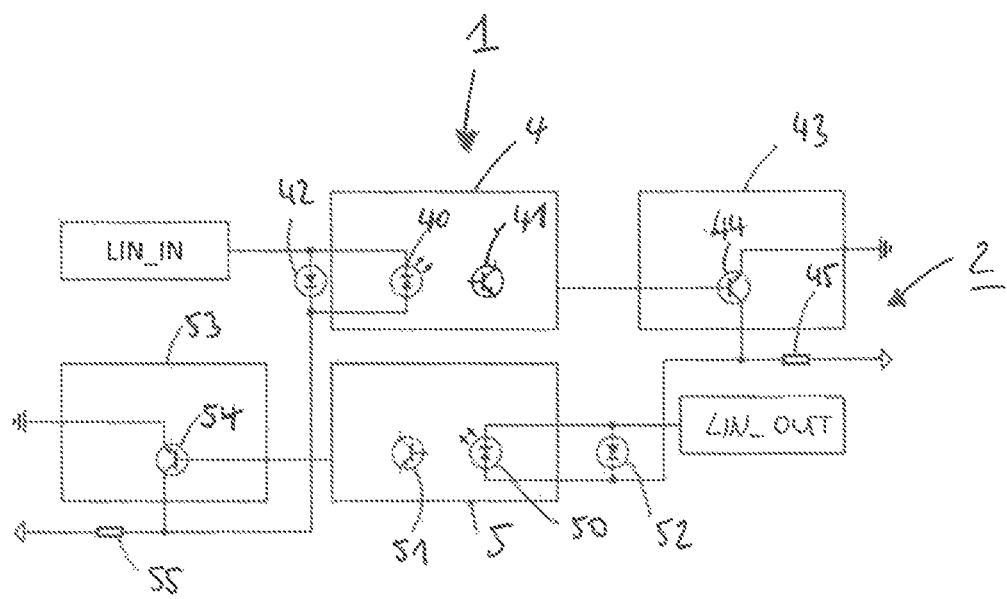

GALVANIC ISOLATION DEVICE FOR A LIN BUS SYSTEM

CROSS-REFERENCE TO RELATED APPLICATION

This application claims priority under 35 U.S.C. § 119(b) to German Patent Application No. 10 2019 129 075.9, filed Oct. 28, 2019, the disclosure of which is incorporated herein by reference.

BACKGROUND

The present invention relates to a galvanic isolation device.

In motor vehicles, a LIN (Local Interconnect Network) bus is used for communication, along with other components. These bus systems are present in the lower control, measurement and control levels. They are used for transmitting signals between sensors, actuators, controllers (e.g. PLC=programmable-logic controllers), computers and process control systems.

In 48V applications, a galvanic isolation of the LIN bus is necessary, which offers effective protection against overvoltage, ground offset and reverse current, while at the same time improving signal quality in EMC disturbed application environments.

Typically, the galvanic isolation is created by means of a LIN transceiver and a digital isolator. The digital isolator therein is arranged between the LIN transceiver and the microcontroller. The disadvantages of this solution are the use of two microcontroller inputs and the unused integrated LIN transceiver of the microcontroller.

BRIEF SUMMARY OF THE DISCLOSURE

Thus, the problem underlying the present invention is to provide a galvanic isolation device of a LIN bus, which requires little space and is cost-effective.

This problem may be solved by a galvanic isolation device with the features as found in the accompanying claims.

Accordingly, a galvanic isolation device is provided for a bidirectional connecting line of a LIN bus system with two optocouplers arranged in antiparallel, each having a light-emitting element and a light-receiving element, wherein the galvanic isolation device can be connected to a LIN bus via a first signal connection and to a microprocessor via a second signal connection, wherein each signal connection is connected to the respective light-emitting element of an optocoupler, and a diode is connected in antiparallel to the light-emitting element, such that, when a low signal level is applied to one of the signal connections, the signal level at the other signal connection is also low, without the signal being fed back. An optocoupler can thus be bypassed by the diode coupling if the signal is sent in the opposite direction. A processor therefore is not necessary to create a circuit comprising the optocouplers. The isolation device is therefore particularly simple and cost-effective.

Preferably, an amplifier circuit raising the signal to the desired voltage level is associated with each light-receiving element of an optocoupler. The amplifier circuit is preferably an external amplifier circuit, which is not integrated in the optocoupler. Such an embodiment is particularly advantageous in the automotive sector.

In a preferred embodiment, the amplifier circuit comprises a power amplifier consisting of a P-FET and an N-FET.

Further preferably, pull-up resistors are provided, which are selected in such a way that the outputs are set to supply voltage if no signal is present at the signal connections.

It is advantageous if the galvanic isolation device is implemented by means of a LIN transceiver integrated in the microcontroller.

Furthermore, a LIN bus system with a previously described galvanic isolation device is provided.

BRIEF DESCRIPTION OF THE DRAWING

The foregoing summary, as well as the following detailed description, will be better understood when read in conjunction with the appended drawing, which is provided for purposes of illustration, only. It should be understood, however, that the invention is not limited to the precise arrangements and instrumentalities shown. In the drawing:

FIG. 1 shows an example of a galvanic isolation device according to various aspects of the present disclosure

DETAILED DESCRIPTION OF THE INVENTION

A preferred embodiment is shown in FIG. 1. The galvanic isolation device 1 is integrated in a LIN bus system 2 between a LIN bus and a microcontroller. There is a signal connection LIN_IN, which represents a connection to the LIN bus, and a signal connection LIN_OUT, which represents a connection to the microcontroller.

The transmission works bidirectionally; it is not necessary to predefine a direction. Herein, the recessive level is the supply voltage. As soon as one of the two sides pulls the bus signal down to ground potential, the other follows. The galvanic isolation device 1 comprises two galvanic isolation elements 4,5, which are formed as optocouplers. The optocouplers 4,5 are connected in antiparallel.

Each optocoupler 4,5 has a light-emitting element 40,50 and a light-receiving element 41,51. The light-emitting element 40 of the first optocoupler 4 is connected to the signal connection LIN_IN. The light-emitting element 50 of the second optocoupler 5 is connected to the signal connection LIN_OUT. A diode 42,52 is connected to each light-emitting element 40,50 in antiparallel.

A first amplifier circuit 43 is connected to the light-receiving element 41 of the first optocoupler 4. The transistor 44 shown symbolizes various amplifier circuits, which are selected as required.

The amplifier circuit 43 can also be integrated into the optocoupler 4. For special applications with higher requirements, such as in the automotive sector, it is preferable that the external amplifier circuit shown here is provided, as no AEC-Q certified optocoupler is so far available with sufficient, integrated amplification with which the quiescent current requirements can be met.

A second amplifier circuit 53 is connected to the light-receiving element 51 of the second optocoupler 5. The transistor 54 shown here again symbolizes various amplifier circuits, which are selected as required.

Pull up resistors 45,55 are provided, which each hold the signal at supply voltage potential via the respective diode 42,52, which is connected in antiparallel, as long as the output transistor 41,51 of the optocoupler 4,5 has not switched.

A low signal present at LIN_IN results in a current flowing through the second pull-up resistor 55 and the first emitting element 40 of the first optocoupler 4. The output transistor 41 of the first optocoupler 4 switches and the signal is amplified by the first amplifier circuit 43. The signal at LIN_OUT is pulled down to a low level via the output transistor 41 of the first optocoupler 4 and the second diode 52 connected in antiparallel to the emitting element 50 of the second optocoupler 5.

Analogously to this, a low signal present at LIN_OUT results in a current flow through the first pull-up resistor 45 and the second emitting element 50 of the second optocoupler 5. The output transistor 51 of the second optocoupler 5 switches and the signal is amplified by the second amplifier circuit 53. The signal at LIN_IN is pulled down to a low level via the output transistor 51 of the second optocoupler 5 and the first diode 42 connected in antiparallel to the emitting element 40 of the first optocoupler 4.

The anti-parallel diodes ensure that there is no feedback; if the LIN signal is pulled down to a low level from the outside, the current flows through the light-emitting element of the optocoupler. A low level caused by the power amplifier results in a current flow in the diode.

The isolation device allows for bidirectional isolation of the LIN bus at the nominal voltage level. External amplifiers are preferably used herein to meet the quiescent current requirements required in the automotive sector. In addition, it is possible to provide LIN flash capability with an internal standard bootloader. The internal LIN transceiver is preferred, as it supports bidirectional communication via one pin, whereby only one microcontroller contact is required.

Furthermore, the isolation device requires only little space on the circuit board and is cost-effective to implement.

In a preferred embodiment of the isolation device, a voltage of 12V is applied to both sides.

This embodiment is advantageous if, for example, an on-board network has a voltage greater than 12V, in particular 48 volts. In this case, most of the electronics are coupled with 48V components for controlling the 48V application. However, the LIN bus operates on a 12V potential, such that a galvanic isolation between the microcontroller and the bus network is achieved by means of an isolation device.

However, it may also be provided that in a pure 12V application a 12V to 12V galvanic isolation is achieved by means of the isolation device.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A galvanic isolation device for a bidirectional connecting line of a local interconnect network (LIN) bus system, the galvanic isolation device including:
   two optocouplers arranged in antiparallel, each comprising a light-emitting element and a light-receiving element, wherein the galvanic isolation device is connectable to a LIN bus via a first signal connection and to a microprocessor via a second signal connection, wherein each of the first and second signal connections is connected to the respective light-emitting element of a respective optocoupler, and wherein a respective diode is connected in antiparallel to the respective light-emitting element of the respective optocoupler, such that, when a low signal level is applied to one of the first or second signal connections, the signal level at the other one of the first or second signal connections is also low, without signal feedback.

2. The galvanic isolation device according to claim 1, further including a respective amplifier circuit associated with the respective light-receiving element of a respective one of the optocouplers and configured to raise a signal level output from the respective light-receiving element to a desired voltage level.

3. The galvanic isolation device according to claim 2, the respective amplifier circuit comprises a power amplifier comprising a p-type field-effect transistor (P-FET) and an n-type field effect transistor (N-FET).

4. The galvanic isolation device according to claim 3, wherein the galvanic isolation device further includes pull-up resistors which are selected in such a way that outputs of the galvanic isolation device at the first and second signal connections are set to supply voltage if no signal is present at the first and second signal connections.

5. The galvanic isolation device according to claim 1, wherein the galvanic isolation device is implemented by means of a LIN transceiver integrated in the microcontroller.

6. A local interconnect network (LIN) bus system including:
   a LIN bus; and
   the galvanic isolation device according to claim 1 and coupled to the LIN bus by the first signal connection of the galvanic isolation device.

* * * * *